(12) United States Patent
Marschke et al.

(10) Patent No.: US 10,813,496 B2
(45) Date of Patent: Oct. 27, 2020

(54) SECONDARY CIRCUIT AND TIMING DEVICE FOR APPLIANCE

(71) Applicant: Spectrum Brands, Inc., Middleton, WI (US)

(72) Inventors: Karl Warner Marschke, Verona, WI (US); Brian Lloyd Vodvarka, Grand Marsh, WI (US); Rajesh Kumar, Middleton, WI (US)

(73) Assignee: Spectrum Brands, Inc., Middleton, WI (US)

( * ) Notice: Subject to any disclaimer, the term of this patent is extended or adjusted under 35 U.S.C. 154(b) by 418 days.

(21) Appl. No.: 15/643,541

(22) Filed: Jul. 7, 2017

(65) Prior Publication Data
US 2019/0008323 A1  Jan. 10, 2019

(51) Int. Cl.
| | |
|---|---|
| *H05B 1/02* | (2006.01) |
| *A47J 37/08* | (2006.01) |
| *H03K 17/284* | (2006.01) |
| *H03K 17/296* | (2006.01) |

(52) U.S. Cl.
CPC ........ *A47J 37/0842* (2013.01); *H03K 17/284* (2013.01); *H03K 17/296* (2013.01); *H05B 1/0225* (2013.01); *H05B 1/0261* (2013.01)

(58) Field of Classification Search
CPC . A47J 37/0842; H05K 17/284; H03K 17/296; H05B 1/0225; H05B 1/0261; H05B 2203/007; H05B 1/02
USPC ................ 219/492, 494, 497, 505, 518, 519
See application file for complete search history.

(56) References Cited

U.S. PATENT DOCUMENTS

| | | | |
|---|---|---|---|
| 3,956,978 A | 5/1976 | Borley | |
| 4,755,656 A | 7/1988 | Charlesworth et al. | |
| 4,976,194 A * | 12/1990 | Kelterborn | .......... A47J 37/0842 219/411 |
| 5,044,263 A | 9/1991 | Birkert et al. | |

(Continued)

FOREIGN PATENT DOCUMENTS

| | | |
|---|---|---|
| CN | 87211991 U | 9/1988 |
| CN | 203366037 U | 12/2013 |

(Continued)

OTHER PUBLICATIONS

International Search Report for co-pending PCT/US2018/039294, 3 pages, dated Oct. 29, 2018.

*Primary Examiner* — Mark H Paschall
(74) *Attorney, Agent, or Firm* — Kagan Binder, PLLC (57) ABSTRACT

A circuit configuration is disclosed for use in an appliance includes a power switch configured to open and close a first group of electrical contacts, where the contacts while closed cause the appliance to energize upon a user initiating a use of the appliance. The circuit configuration also includes a primary timing device electrically connected to the first group of electrical contacts, the primary timing device being actuated upon energization of the appliance and the primary timing device being configured to de-energize the appliance after a first time period by opening the first group of electrical contacts. The circuit configuration also includes a secondary timing device electrically connected to the power switch by a second group of electrical contacts, where the secondary timing device is configured to de-energize the appliance after a second time period, where the second time period is set based on the first time period.

20 Claims, 7 Drawing Sheets

(56) References Cited

U.S. PATENT DOCUMENTS

| | | | |
|---|---|---|---|
| 5,088,389 A | 2/1992 | Labadia del Fresno | |
| 5,094,154 A | 3/1992 | Nopanen | |
| 5,128,521 A * | 7/1992 | Lanno | A47J 37/0842 |
| | | | 219/492 |
| 5,283,421 A | 2/1994 | Richards | |
| 5,304,782 A | 4/1994 | McNair et al. | |
| 5,385,082 A | 1/1995 | Huggler et al. | |
| 5,438,914 A | 8/1995 | Hohn et al. | |
| 6,140,621 A * | 10/2000 | Ho | A47J 37/0623 |
| | | | 219/492 |
| 6,382,084 B2 | 5/2002 | Chan et al. | |
| 6,429,407 B1 | 8/2002 | Garber et al. | |
| 6,525,914 B1 | 2/2003 | Legatti | |
| 6,630,184 B2 | 10/2003 | Chung et al. | |
| 6,829,123 B2 | 12/2004 | Legatti et al. | |
| 8,402,884 B2 | 3/2013 | Choi | |
| 8,710,406 B2 | 4/2014 | Sanders et al. | |
| 9,510,394 B2 | 11/2016 | Legatti | |
| 10,376,100 B2 | 8/2019 | Yan et al. | |
| 10,468,911 B2 | 11/2019 | Lo Conte et al. | |
| 2002/0047005 A1 | 4/2002 | Nguyen | |
| 2003/0133236 A1 | 7/2003 | Legatti et al. | |
| 2003/0198001 A1* | 10/2003 | Lile | A47J 37/0842 |
| | | | 361/157 |
| 2006/0162573 A1 | 7/2006 | Yip | |
| 2006/0207437 A1 | 9/2006 | Zhang et al. | |
| 2008/0279998 A1 | 11/2008 | Park | |
| 2009/0127248 A1* | 5/2009 | Itou | F24C 7/082 |
| | | | 219/489 |
| 2010/0073838 A1 | 3/2010 | Sanders et al. | |
| 2012/0132635 A1* | 5/2012 | Mishra | G08B 17/00 |
| | | | 219/209 |
| 2013/0247778 A1 | 9/2013 | Legatti | |
| 2013/0334203 A1* | 12/2013 | Legatti | H05B 1/0261 |
| | | | 219/509 |
| 2019/0178501 A1 | 6/2019 | Baas et al. | |
| 2019/0178502 A1 | 6/2019 | Babu et al. | |
| 2019/0208955 A1 | 7/2019 | Stilo et al. | |
| 2019/0238082 A1 | 8/2019 | Zhao et al. | |
| 2019/0247778 A1 | 8/2019 | Handte et al. | |

FOREIGN PATENT DOCUMENTS

| | | | |
|---|---|---|---|
| CN | 203524516 U | 4/2014 | |
| CN | 203896513 U | 10/2014 | |
| CN | 107342577 A | 11/2017 | |
| CN | 206671934 U | 11/2017 | |
| CN | 207055380 U | 3/2018 | |
| CN | 207542769 U | 6/2018 | |
| EP | 0 237 330 | * 11/1987 | A47J 37/0835 |
| EP | 3258556 B1 | 12/2017 | |
| GB | 2186128 A | 8/1987 | |
| GB | 2422293 A | 7/2017 | |
| WO | 2006045242 A1 | 5/2006 | |
| WO | 2013148532 A2 | 10/2013 | |
| WO | 2013148533 A2 | 10/2013 | |
| WO | 2013148535 A1 | 10/2013 | |
| WO | 2014007967 A1 | 1/2014 | |

* cited by examiner

SECONDARY CIRCUIT AND TIMING DEVICE FOR APPLIANCE

BACKGROUND

The present invention is directed to a power cut-off circuit configuration, and in particular to a secondary power cut-off device for an appliance, such as a toaster.

Appliances, such as toasters, can utilize heating elements or other components to heat, toast, and/or cook items, such as food to be toasted. Heating elements generally convert electricity into heat by passing the electricity through a metal of high resistivity, causing energy passing therethrough to be converted to heat that is emitted by the heat element. Some examples of heat element materials include Nichrome (nickel and chromium), ceramic materials (such as molybdenum disilicide), polymers, composites, and combinations thereof. During appliance use, one or more heating elements may cause items being heated thereby to become overheated in cases of overuse or malfunction. For example, it can be undesirable to heat a food item too long.

To date, various mechanical and circuit-based configurations have been used to limit the heating and control timing related to appliance misuse or malfunction. For instance, in one example, a thermal sensor is built into an appliance, which can signal to a heating control unit that the item being heated is at risk of being overheated based on a heat and time-based threshold.

SUMMARY

The present invention overcomes shortcomings of the prior art by introducing a secondary circuit configured to automatically break an appliance heating element power circuit after a set time that is preferably chosen to be longer than the maximum time an item can be cooked by the appliance heating element.

According to a first aspect, a circuit configuration is disclosed for use in an appliance. The circuit configuration includes a power switch electrically coupled to a power source, the power switch configured to open and close a first group of electrical contacts, where the contacts while closed cause the appliance to energize upon a user initiating a use of the appliance. The circuit configuration also includes a primary timing device electrically connected to the first group of electrical contacts, the primary timing device being actuated upon energization of the appliance and the primary timing device being configured to de-energize the appliance after a first time period by opening the first group of electrical contacts. The circuit configuration also includes a secondary timing device electrically connected to the power switch by a second group of electrical contacts, where the secondary timing device is configured to de-energize the appliance after a second time period, where the second time period is set based on the first time period, and where the second time period is a third time period longer than the first time period.

According to a second aspect, toaster including a power cut-off function is disclosed. The toaster includes a power switch electrically coupled to a power source, the power switch configured to open and close a first group of electrical contacts, where the contacts while closed cause the appliance to energize upon a user initiating a use of the appliance. The toaster also includes a primary timing device electrically connected to the first group of electrical contacts, the primary timing device being actuated upon energization of the appliance and the primary timing device being configured to de-energize the toaster after a first time period by opening the first group of electrical contacts. The toaster also includes a secondary timing device electrically connected to the power switch by a second group of electrical contacts, where the secondary timing device is configured to de-energize the appliance after a second time period, where the second time period is based on the first time period, and where the second time period is a third time period longer than the first time period.

According to a third aspect, a method for controlling an appliance is disclosed. The method includes receiving an input to energize an appliance, where the appliance includes a heating unit. The method also includes activating a primary timing device of the appliance upon the energizing the appliance, where the primary timing device is connected to a first group of electrical contacts, and where the primary timing device is configured to de-energize the appliance after a first time period by opening the first group of electrical contacts. The method also includes setting a second time period based on the first time period, where the second time period is set to be a third time period longer than the first time period. The method also includes activating a secondary timing device of the appliance upon the energizing the appliance, where the secondary timing device is connected to a second group of electrical contacts, and where the secondary timing device is configured to de-energize the appliance after the second time period.

DETAILED DESCRIPTION OF THE PREFERRED EMBODIMENTS

Figure 1:
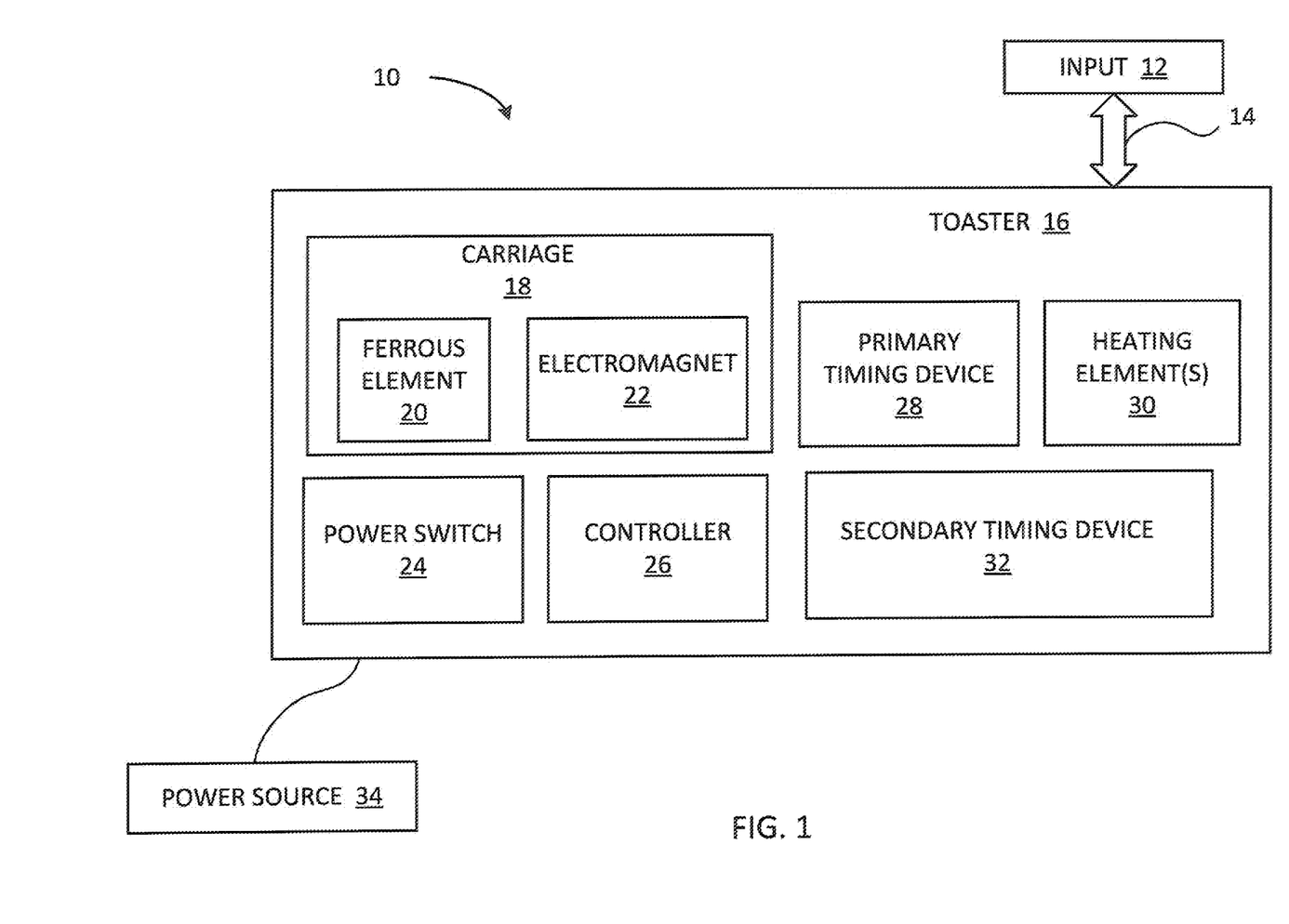
FIG. 1 is a schematic representation of a toaster system including a toaster, according to various embodiments.

FIG. 1 is a schematic representation of a toaster system 10 including a toaster 16, according to various embodiments.

Toaster 16 can be an appliance, as used herein. Toaster 16 can receive an input 12, for example, from a user, computer, or other external source. Input 12 can be received at toaster 16 through various input methods and systems 14, such as buttons, knobs, plungers, levers, etc. Toaster 16 can include a carriage module 18, which can include a ferrous element 20 and an electromagnet 22, which can be used to hold down carriage 18. Electromagnet 22 can be similar to electromagnet 136 of FIG. 2A, described below, according to various embodiments.

Toaster 16 can also include a primary timing device 28, a secondary timing device 32, heating element(s) 30, a controller 26, and a power switch 24. Power switch 24 can be used to regulate power flow from power source 34 to toaster 16, and may be actuated by controller 26 and/or through primary timing device 28 or secondary timing device 32. Additional features and variations on the toaster 16 configuration are contemplated within the scope of this disclosure.

Figure 2A:
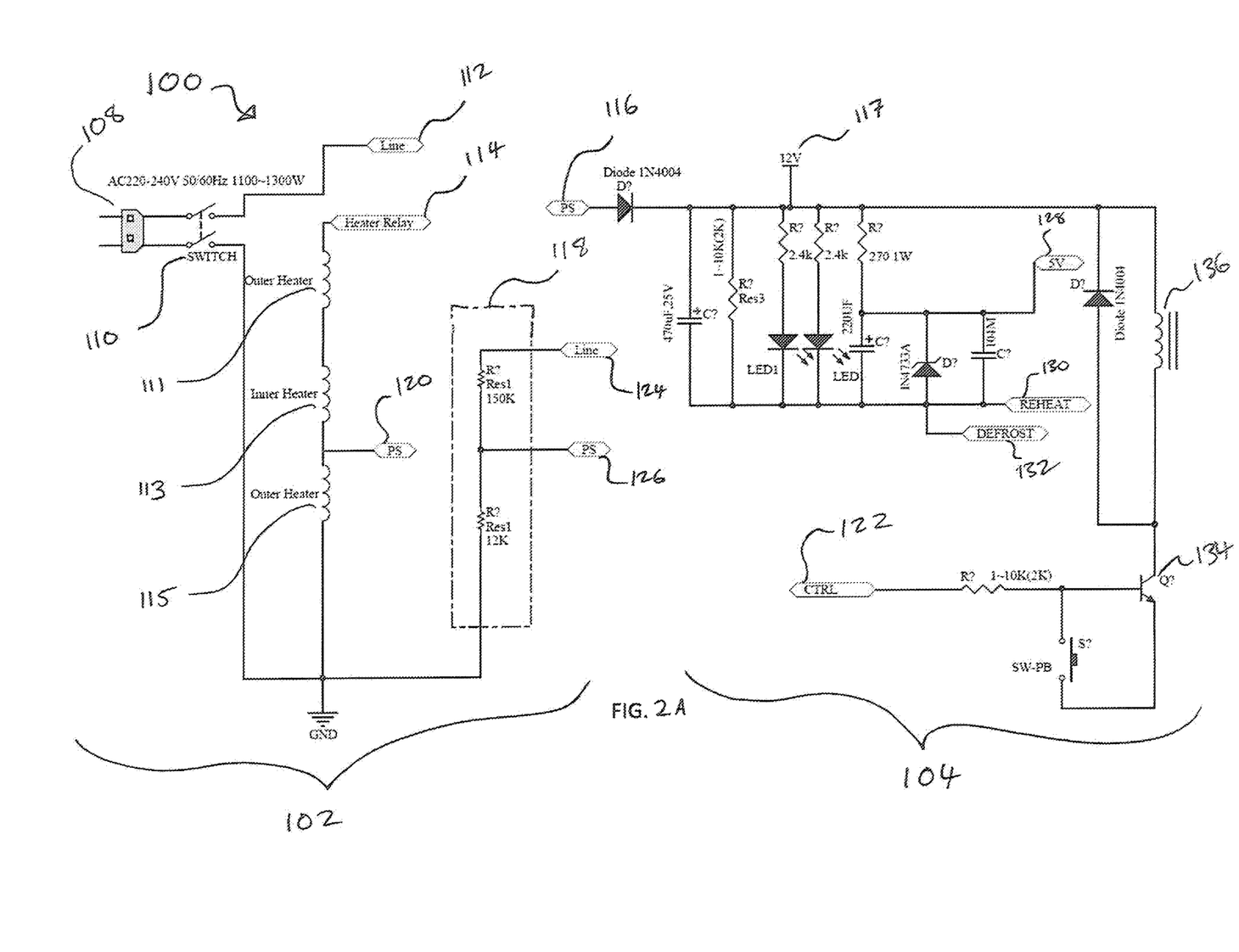
FIG. 2A is an example configuration of an appliance power supply circuit, according to various embodiments.

FIG. 2A is an example configuration of an appliance power supply (PS) circuit 100, according to various embodiments. According to the shown example, the circuit can be configured for use in an appliance, such as a pop-up electric toaster (an example of which is schematically shown as toaster 16 of FIG. 1).

PS circuit 100 can be separated into two circuit sub-components, with a heating portion 102 shown at left and an electromagnetic ejection portion 104 shown at right of FIG. 2A. Alternatively, heating portion 102 and ejection portion 104 can compose a single PS circuit 100. Various electrical connection points are represented. A power source 108 can be an alternating current (AC) source, and may be preferably received at either 110-120V or 220-240V, 50-60 Hz, and preferably at a power level of 1100-1300 W, according to various embodiments. A main power switch 110 (e.g., power switch 24 of FIG. 1) can be activated by a user, computer system, or other control according to various embodiments. Where the example appliance is a toaster, pressing down on a carriage lever (e.g., part of carriage module 18 of FIG. 1) may activate power toaster power switch 110.

Power switch 110 may have a first group of electrical contacts including a first pole and a second pole, where the power switch 110 is connected at the first pole to a line 112, and at the second pole to a ground, an inner heater 113 and two outer heaters 111 and 115 connected in series, and a heater relay connection 114. Also connected to the second pole is a PS connection 120, and optionally two resistors shown in box 118, preferably to be utilized where a normally-open relay is employed in circuit 100 in the heating portion 102. Electrically coupled to the resistors in box 118 are line connection 124 and PS connection 126.

The other, ejection portion 104 of PS circuit 100 can preferably include a PS connection 116 with diodes, resistors, capacitors, transistor 134, and at least one electromagnet 136 (e.g., for use in carriage ejection), as shown. A 5V connection 128 and 12V connection 117 may be included, along with a reheat connection 130, a defrost connection 132, and a control connection 122. Control connection 122, reheat connection 130, and defrost connection 132 can be connected to a controller 200, as described in FIG. 2B.

Various circuit components of PS circuit 100 (and other circuits, herein) can be selected such that various specifications of the circuit components is appropriate based on implementation and configuration. Such components could be selected for various configurations by those skilled in the art.

Figure 2B:
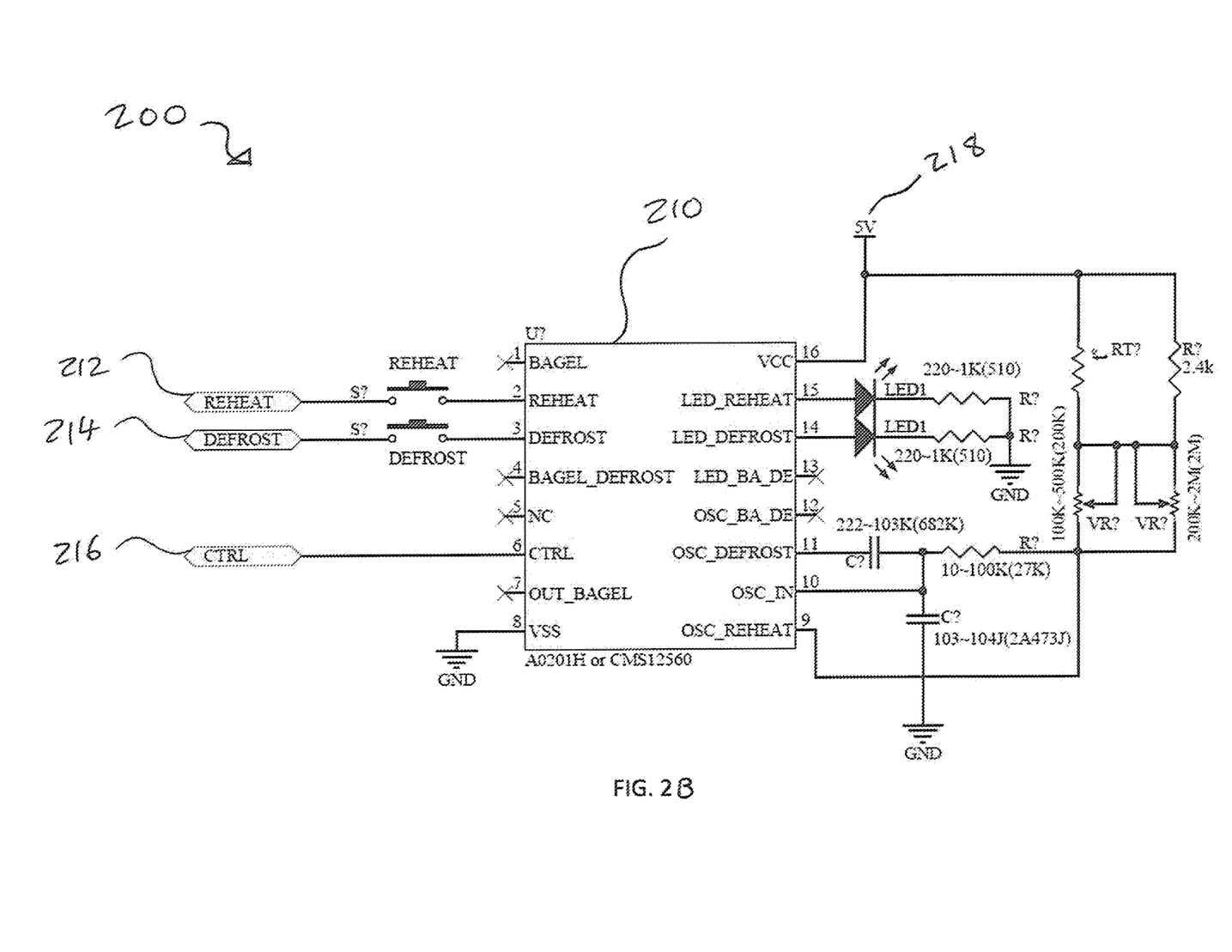
FIG. 2B is a controller circuit for use with power supply circuit in an appliance, according to various embodiments.

FIG. 2B is a controller circuit 200 for use with power supply (PS) circuit 100 in an appliance, according to various embodiments.

Controller circuit 200 is a primary controller circuit for an appliance, preferably a toaster (e.g., toaster 16 FIG. 1). Controller circuit 200 includes an integrated circuit (IC) (e.g., an application-specific integrated circuit (ASIC)) 210, and connections for the controller circuit 200 to be operatively connected to PS circuit 100 of FIG. 2A. ASIC 210 can have many connections, and can include many IC components, depending on configuration. Examples of ASIC 210 may include ICs, such as commercially-available CMS12560 and/or A0201H timing chips, according to various embodiments. A 5V connection 218 to ASIC 210 can be included, as shown. A reheat connection 212 may be configured to connect to reheat connection 130 of FIG. 1A, a defrost connection 214 may be configured to connect to defrost connection 132 of FIG. 1A, and control connection 216 may be configured to transmit control commands to control connection 122 of circuit 100 of FIG. 1A. Together, circuits 100 and 200 may form a single circuit including both PS and control aspects of an appliance, according to various embodiments.

Figure 3:
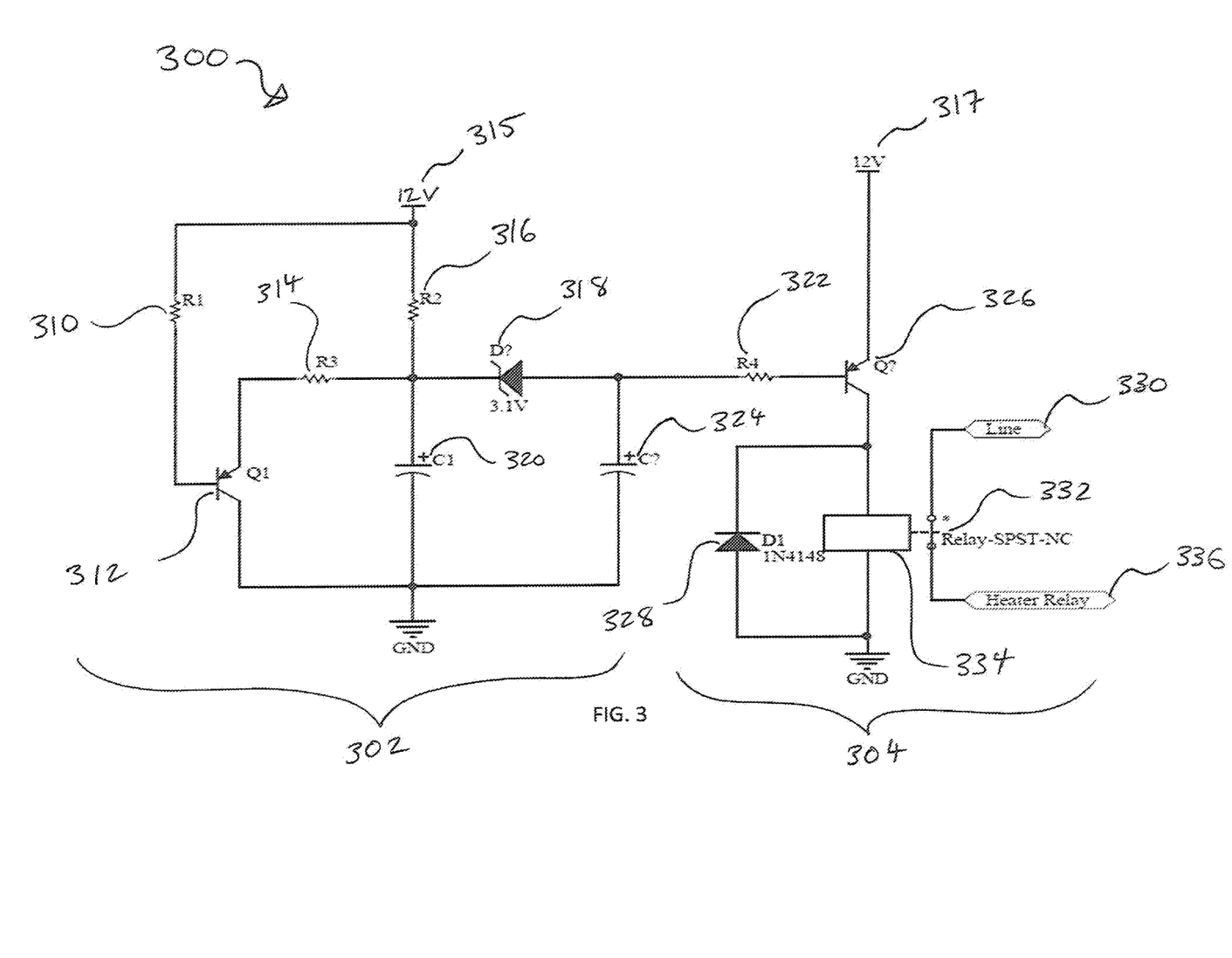
FIG. 3 is an embodiment of a transistor-based secondary circuit, according to an aspect of the present invention.
Figure 4:
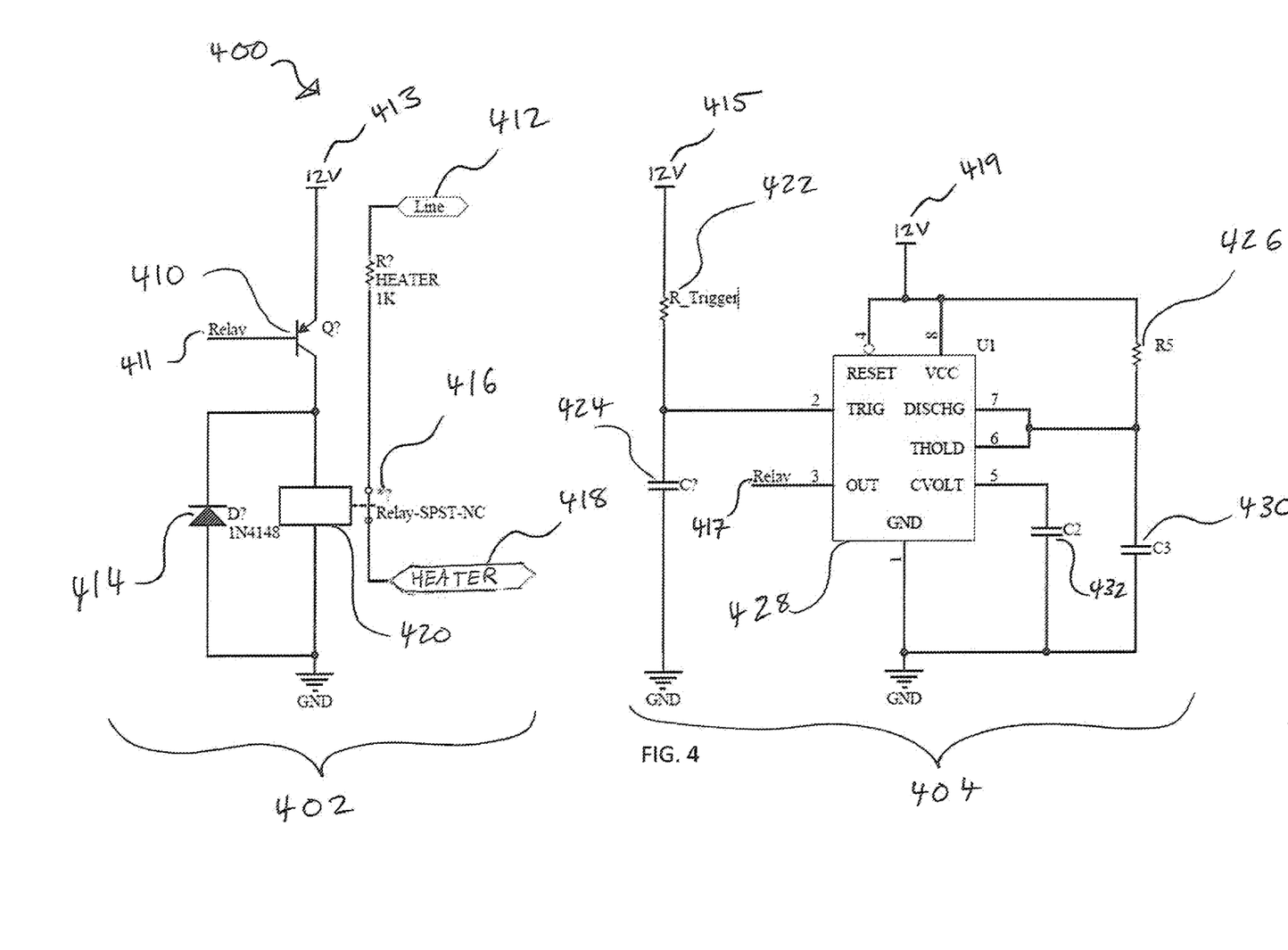
FIG. 4 is a transistor and integrated-circuit-based embodiment of a secondary circuit, according to an aspect of the present invention.
Figure 5:
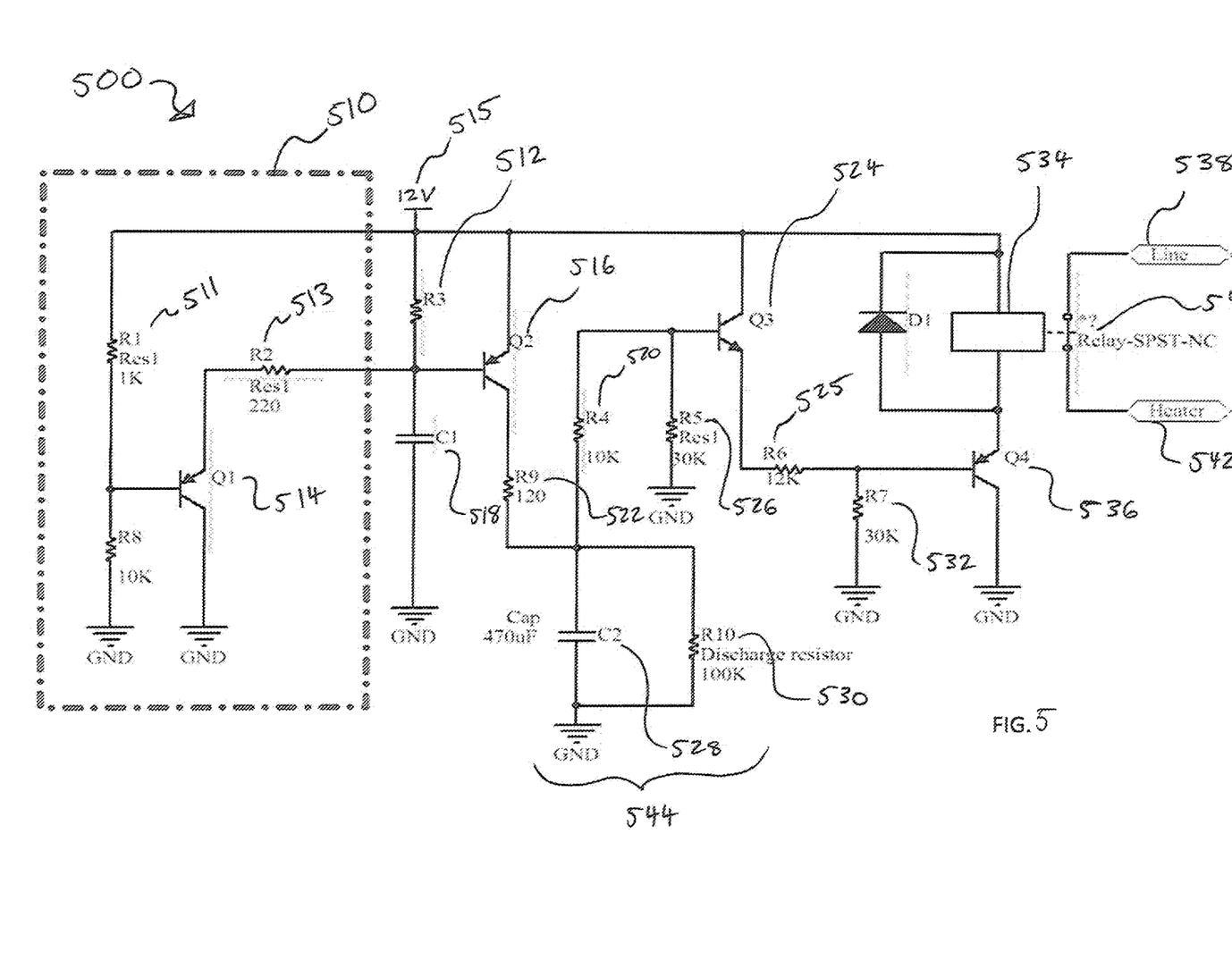
FIG. 5 is another embodiment of a transistor-based secondary circuit, according to an aspect of the present invention.

FIGS. 3-5 are three embodiments of a secondary circuit, according to various embodiments of this disclosure.

FIG. 3 is an embodiment of a transistor-based secondary circuit 300, according to an aspect of the present invention.

An appliance (e.g., toaster 16 of FIG. 1) can include (PS and control) circuits 100 and 200 of FIGS. 2A and 2B, and can operate nominally under standard conditions without further safeguards against overheating. A secondary circuit 300, having an RC circuit 302 and a relay circuit 304, can be introduced in order to prevent overheating of the toaster and/or food item. It is known that toasters employ a timing device to prescribe how long a piece of bread, bagel, etc. should preferably be toasted before ejecting. According to this disclosure, a secondary circuit 300 can be or include a secondary timing device (e.g., circuit 300) in order to act as a power-cutting, circuit-breaking fail safe in a case where a primary timing device fails to operate properly.

When a user operates a toaster including the secondary circuit 300, power switch 110 is closed (e.g., when a toaster carriage having a ferrous element is pressed down) power is applied to the circuit 300, a carriage-holding electromagnet (e.g., 136 of FIG. 2A) is energized and holds the carriage in place, using the ferrous element, against biased ejection springs (not shown). Circuit 300 can include a 12V electrical input 315 at the RC circuit 302 and a 12V electrical input 317 at the relay circuit 304. Both 12V inputs can be connected to and received from PS connection 117, which can be a rectified, tapped a heater winding, filter it and then use it as a 12 volt supply. The carriage can be held down for a set amount of time based on either consumer settings or inputs of external toaster controls at a primary timing device (not shown). In some embodiments, the amount of time can be set by the primary timing device automatically based on conditions or detected requirements. Of note, the secondary circuit 300 (and secondary timing device) can have a time set based on a time set on the primary timing device. For example, a time set on the secondary circuit can be 30 seconds longer than a time period set on the primary timing device. According to various embodiments, there may be a maximum time period setting for the primary timing device. According to another embodiment, a time period setting of the secondary circuit 300 can be set such that it is a time period longer than the longest possible setting of the primary timing device. The delay can be shorter or longer as determined to provide a desired release using relay circuit 304.

At the same time at the carriage is held down and the toaster begins heating operation, a direct current (DC) voltage (e.g., 12V from PS connection 117) can be applied to a secondary circuit 300 (or circuit 400 of FIG. 4, among other embodiments). As shown, transistor $Q_?$ 326 can preferably be selected to be a PNP transistor that can operate as normally closed (electrically connected) switches when no bias is applied to the transistor base. Transistor $Q_?$ 326 can include a base, an emitter, and a collector. The collector of transistor $Q_?$ 326 can be electrically grounded, the base can be connected to a resistor-capacitor (RC) circuit 302, and the emitter can be connected to relay circuit 304. In this case, no bias would be applied at toaster activation due to the RC circuit 302 composed of $R_2$ at 316 and capacitor $C_1$ at 320. The RC circuit 302 can be grounded, as shown.

As the RC circuit 302 charges up over time from a biased voltage input (preferably 12V, as shown) from a PS connection 117, e.g., from PS 100 of FIG. 2A, the transistor $Q_?$ 326 base becomes increasingly biased (shown also as charge curve 512 of FIG. 5), and transistor $Q_?$ 326 having its base connected to the RC circuit 302 and emitter connected to relay circuit 304, can be reached through resistor $R_4$ 322. RC circuit 203 may have a characteristic charge time "tau," based on various components' specifications. A reverse-bias Zener diode 318 can be included in RC circuit 302, electrically connected on an output end to resistor $R_4$ 322 and capacitor $C_?$ 324 (leading to transistor $Q_?$ 326 and a relay 334 and associated relay switch 332 of relay circuit 304). The Zener diode 318 can be connected on the other end to resistors R2 316 and R3 314 and to capacitor $C_1$ 320 within RC circuit 302. The Zener diode 318 (with a particular corresponding Zener breakdown voltage) can be placed in the base leg of transistor $Q_?$ 326 so that the circuit 300 and transistor $Q_?$ 326 do not activate until the specific Zener breakdown voltage has been reached during the RC charge time of RC circuit 302. The characteristic RC charge time may be a function of the various components of RC circuit 302. If the characteristic Zener breakdown is reached, the relay circuit 304 can de-energize a heating element (e.g., 30 of FIG. 1) of an appliance (e.g., toaster 16 of FIG. 1). According to a preferred embodiment, relay 334 can be normally open.

The closed switch 110 condition (see FIG. 2A), once adequate charge is built up in the RC circuit 302, applies voltage to the base of transistor $Q_?$ 326, thereby turning transistor $Q_?$ 326 "on." By turning on transistor $Q_?$ 326, relay 334 of relay circuit 304 is energized by 12V electrical input 317 from PS 100 connection 117. Relay 334 can be connected in series with the power switch 110. Also as shown, diode $D_1$ 328 (e.g., a commercially-available standard silicon switching diode, such as a 1N4148 signal diode) is of reverse-bias and is located in a circuit from transistor $Q_?$ 326 to ground in order to protect transistor $Q_?$326 from back electromotive force (EMF) from the relay switch 332 of relay 334. Relay switch 332 is connected to relay 334, which is shown connected to line connection 330 and heater relay connection 336 at two electrical contacts or poles. Line connection 330 and heater relay connection 336 can then be used to de-energize the appliance, as described herein.

Once the RC circuit 302 has been sufficiently charged after a time by 5V input 315, RC circuit 302 can place a bias on the base of transistor $Q_?$ 326 which opens the closed switch characteristic of transistor Q? 326, energizing relay 334. As relay 334 is energized, the 12V input from the relay 334 is removed at relay switch 332, thereby shutting down and de-energizing the heating element(s) of the appliance. The RC time constant (e.g., tau) can be chosen to be less than 30 seconds longer than the longest time period of the longest toaster setting, about 30 seconds longer, or more than 30 seconds longer.

Secondary circuit 300 can trigger after the RC time constant is reached, and secondary circuit 300 can remove (de-energize) all AC input power from the various circuit components by opening the power switch 110, and bias can be removed from transistor $Q_1$ 312 through resistor $R_1$ 310, causing transistor $Q_1$ 312 to now operate as a closed switch, allowing capacitor $C_1$ 320 to discharge through resistor $R_3$ 314 and thereby removing the bias from transistor $Q_?$ 326, and activating (or deactivating) relay circuit 304 accordingly.

FIG. 4 is a transistor and integrated-circuit-based embodiment of a secondary circuit 400, according to an aspect of the present invention.

When the power switch 110 is closed (e.g., when the carriage of a toaster is lowered or pressed down) power is applied to a circuit 400, and the holding electromagnet (e.g., 136 of FIG. 2A or 22 of FIG. 1) is thereby energized. The energized electromagnet can hold the carriage (e.g., carriage module of FIG. 1) in place for a set amount of time, for example based on consumer settings of the external controls. As explained with respect to FIG. 3, a secondary circuit 300 (e.g., a secondary timing device) can include an RC circuit 302 including at least one resistor and at least one capacitor can be configured to set the trigger timing of the circuit. Alternatively, instead of employing an RC circuit 302, the secondary timing device and circuit can include a timer circuit 404 including a timer circuit device, e.g., a "555," "556," "558," or "559" timer integrated circuit, as are commercially available. Examples of timer integrated circuits can include a plurality of transistors, diodes, and resistors on a silicon chip, and can include a plurality of connections, such as grounds, triggers, output, input, control, reset, etc. Based on inputs and configurations, timer circuit 404 can be set for various time periods, including about 30 seconds longer than the longest time period of the longest toaster time setting, less than 30 seconds longer, greater than 30 seconds longer, or any other suitable time longer than the applicable toaster time setting.

As shown in FIG. 4, components including transistor $Q_?$ at 410, diode $D_?$ at 414, relay at 420, associated relay switch at 416, and line connection at 412 and heate connection at 418 can be similar to the various connections described as to circuit 304 in FIG. 3. However, instead of employing the RC circuit 302 of FIG. 3, FIG. 4, as shown, employs the timer circuit 404 including an integrated timing circuit device 428 configured to set a time period leading to increased appliance control. Also shown are capacitors $C_?$ 424, $C_2$ 432, $C_3$ 430, resistor $R_5$ 426, and resistor trigger 422 connected to a positive 12V PS voltage (e.g., VCC) 415, for example from 12V connection 117 of PS circuit 100 of FIG. 2A. A second PS VCC 419 can also be connected to resistor R5 426 and timing circuit device 428, as shown. As shown the integrated circuit can be in communication with various relays, circuits, and integrated circuit components, both shown and not shown in various embodiments, herein. Fewer overall components may be employed in circuit 400 than circuit 300, according to various embodiments.

As above, the timing circuit, when a time expires at timer circuit 404, a relay signal is sent via first relay connection 417 to second relay connection 411. When second relay connection receives a timer signal from first relay connection 417, transistor $Q_?$ 410 activates and allows VCC 413 to energize relay 420, triggering the relay 420 and an associated relay switch 416.

FIG. 5 is another embodiment of a transistor-based secondary circuit 500, according to an aspect of the present invention.

Circuit 500 is another alternative, transistor-based embodiment of a secondary circuit, according to the present invention. Circuit 500 can include various components, as shown, and can be connected to a voltage source at 515 as well as a heating element via line connection 538 and heater connection 542. Circuit 500 can be similar to circuit 300 of FIG. 3, but, as shown, can include additional transistors and other circuitry. Circuit 500 can include a transistor $Q_2$ 516 having a base, a collector, and an emitter, an RC circuit 544, and components 510 that can be configured to discharge a capacitor $C_1$ 518 in a case where power has been removed. Components 510 of circuit 500 can include a transistor $Q_1$ 514, which can be a PNP-type transistor. Transistor $Q_1$ 514 can have a base, a collector, and an emitter, with the collector connected to base of transistor $Q_2$ 516. Transistor $Q_1$ 514 can act as a closed switch connecting capacitor $C_1$ to ground through resistors $R_2$ 513 and/or $R_3$ 512. Resistor $R_3$ 512 can act as a current-limit resistor protecting transistor $Q_1$ 514 from high (e.g., short circuit) currents possible during a discharge, for example of capacitor $C_1$ 518.

Transistor $Q_3$ 524 can have a base, a collector, and an emitter, as shown. Transistor $Q_4$ 536 can be a relay coil, and can have a base, a collector, and an emitter, with the collector connected to a relay 534 having a relay switch 540. As shown, resistors $R_1$ 511 and $R_2$ 513 form a voltage divider which can be configured to keep a bias on transistor $Q_1$ 514. As long as AC power is applied at 12V connection 515, the bias on transistor $Q_1$ 514 keeps transistor $Q_1$ 514 from conducting. Transistor $Q_1$ 514 may be configured to conduct only when AC power has been removed. Then transistor $Q_1$ 514 can discharge capacitor $C_1$ 518.

Resistor $R_3$ 513 and capacitor $C_1$ 518, as shown, form an RC circuit configured to bias transistor $Q_2$ 516 after a period of time. The period of time should preferably be long enough to charge capacitor $C_2$ 528 through resistor $R_9$ 522. Once capacitor $C_1$ 518 is charged, it can place a bias on transistor $Q_2$ 516, which can cause transistor $Q_2$ 516 to stop conducting, thereby disconnecting a input voltage from resistor $R_9$ 522 and capacitor $C_2$ 528. As shown, capacitor $C_2$ 528 and resistor $R_{10}$ 530 can form an RC circuit 544 that is configured to set the timing for discharging the capacitor $C_2$ 528. In some embodiments, once capacitor $C_1$ 518 is charged and has therefore preferably placed a bias on transistor $Q_2$ 516, capacitor $C_2$ 528 now can become a power source for circuit 500 until capacitor $C_2$ 528 is drained of its energy charge.

Resistor $R_4$ 520 can be a base bias resistor for transistor $Q_3$ 524, and resistor $R_5$ 526 can hold the base of transistor $Q_3$ 524 low when no bias is applied, according to various embodiments. In various embodiments, transistor $Q_3$ 524 can drive the base of relay coil transistor $Q_4$ 536 through a resistor $R_6$ 525, keeping relay coil transistor $Q_4$ 536 from conducting keeping the relay switch 540 de-energized which can keep relay 534 closed, thereby allowing energy to the heaters via line connection 538 and/or heater connection 542. In a case where capacitor C2 528 has discharged and therefore removed the bias from transistor $Q_3$ 524, transistor $Q_3$ 524 may no longer place a bias on the base of relay coil transistor $Q_4$ 536, causing relay coil transistor $Q_4$ 536 to begin to conduct, thereby energizing the relay coil transistor $Q_4$ 536, and opening relay switch 540 via relay 534, which is configured to de-energizes one or more heaters via line connection 538 and/or heater connection 542. Once AC power has been disconnected (preferably through a switch, such as switch 110), then capacitor $C_1$ 518 can discharge and the process can restart once AC power has been restored to the circuit 500.

Stated different, at an initial appliance (e.g., toaster 16) startup (e.g., when a carriage is initially pressed down by a user), the base of transistor $Q_2$ 516 can be held low by resistor $R_3$ 512 and capacitor $C_1$ 518. For example, capacitor $C_1$ 518 initial voltage condition can preferably be 0V. This setup can preferably allow voltage to pass through transistor $Q_2$ 516 to charge capacitor $C_2$ 528. As shown, resistor $R_9$ 522 can be a current-limiting resistor configured to protect transistor $Q_2$ 516 from excessive current due to example initial charge of 0V on capacitor $C_2$ 528. Once capacitor $C_1$ 518 has been charged sufficiently to bias transistor $Q_2$ 516, transistor $Q_2$ 516 can stop conducting and can in some embodiments effectively disconnects capacitor $C_2$ 528 from 12V input 515, and capacitor $C_2$ 528 can begin to deliver the stored energy to transistor $Q_3$ 524 through the base bias resistor $R_4$ 520. Capacitor $C_2$ 528 and resistor $R_{10}$ 530 form an RC circuit 544 which can set the RC time constant (e.g., "tau"), which can be characteristic of how long the circuit will stay energized. Resistor $R_5$ 526 can be utilized to hold the base of transistor $Q_3$ 524 low when no base bias is being delivered.

During a time that the base of transistor $Q_2$ 516 is forward biased, capacitor $C_2$ 528 can send a base bias to transistor $Q_3$ 524, which can turn it on and deliver a base bias to relay coil transistor $Q_4$ 536. This may preferably prevent relay coil transistor $Q_4$ 536 from conduction and may hold the energy to the relay 534 (and associated relay switch 540) off. The relay 534 being normally closed can allow voltage to the heater(s) via contact 542 and line contact 538. A resistor $R_7$ 532 can hold the base of relay coil transistor $Q_4$ 536 low, preventing it from being biased inadvertently and preferably avoiding false turn-ons in cases where no base bias is present.

In a case where capacitor $C_2$ 528 and resistor $R_{10}$ 530 (RC circuit 544) have dumped all their energy and can therefore no longer provide base bias to transistor $Q_2$ 516, transistor $Q_3$ 524 can lose its base bias and can shut off. This can have the effect of removing the base bias off of relay coil transistor $Q_4$536, turning it on and allowing the relay 534 to energize, thereby opening the relay 534 (and relay switch 540), shutting power off to the heater(s) via heater contact 542 and/or line contact 538. This power-off condition can remain until power to the circuit 500 is removed or disconnected.

A function of transistor $Q_1$ 514 can be to turn on when power has been removed from the circuit 500, effectively discharging capacitor $C_1$518. Once capacitor $C_1$518 has been discharged in this way, the described cycle can start again if and when power is restored. The RC timer circuit 544 composed of $C_2$ 528, and $R_{10}$ 530 can be charged via 12V connection 515, and can be configured to be set to most any time desired as to when to shut the heaters down.

Figure 6:
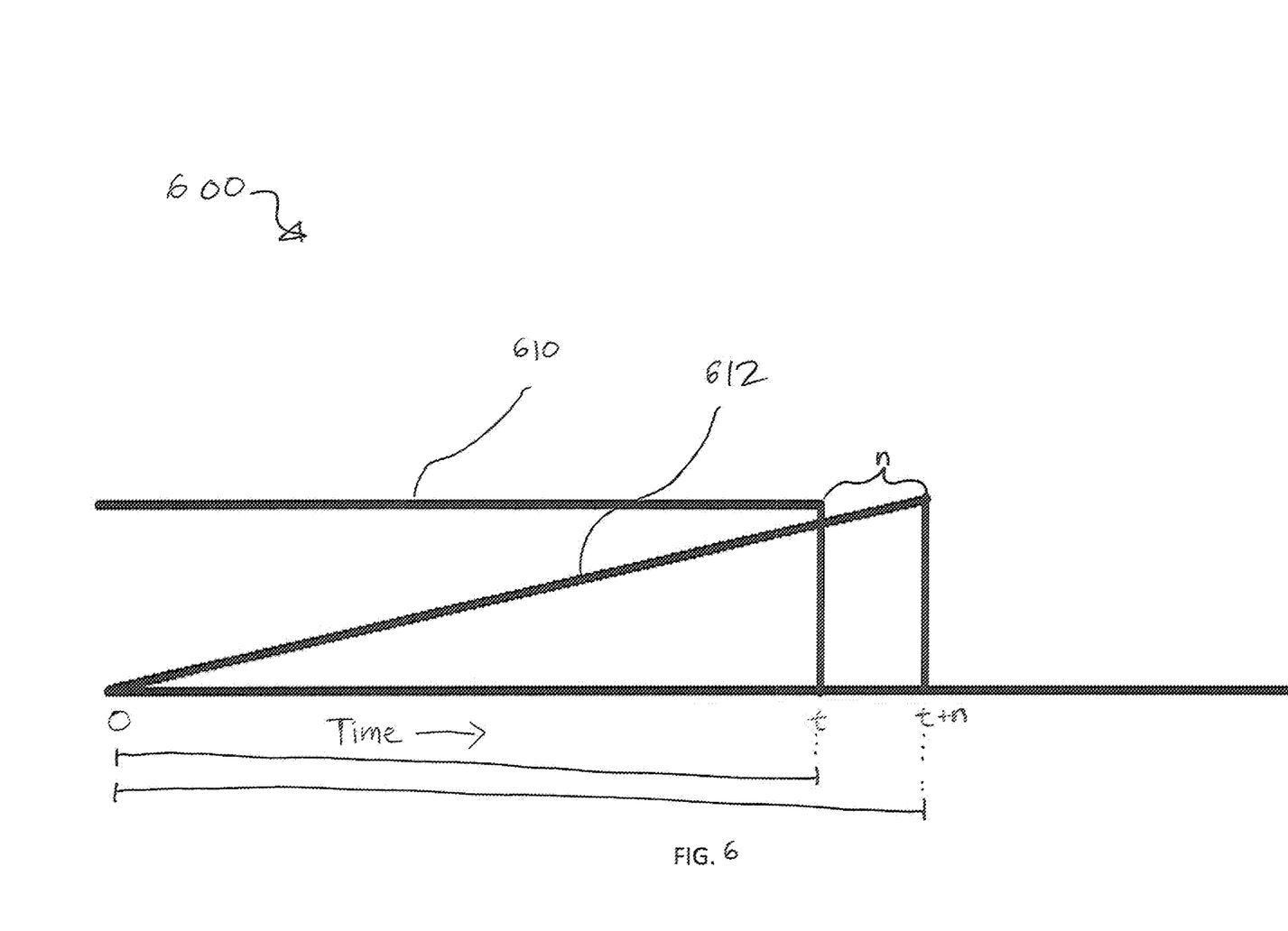
FIG. 6 is a graph showing a first time period t, a second time period t+n, and a third time period n, according to various embodiments.

FIG. 6 is a graph showing a first time period t, a second time period t+n, and a third time period n, according to various embodiments. Primary timing device curve 610 shows an appliance energization curve during normal operation, and secondary timing device curve 612 shows a growing charge (e.g., in the case of an RC circuit such as 302 or 544) where the charge reaches a point and activates a relay, and de-energizes the appliance, as described herein. The curves 610 and 612 may not be drawn to scale, and curve 610 may extend to second time period t+n in a case of malfunction whereby secondary timing device (e.g., 300 or 400) will cause the appliance to de-energize at time t+n, as described herein.

Reference is made herein to the accompanying drawings that form a part hereof and in which are shown by way of illustration at least one specific embodiment. The detailed description provides additional specific embodiments. It is to be understood that other embodiments are contemplated and may be made without departing from the scope or spirit of the present disclosure. The detailed description, therefore, is not to be taken in a limiting sense. While the present disclosure is not so limited, an appreciation of various aspects of the invention will be gained through a discussion of the examples provided.

As used herein, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

Unless otherwise indicated, all numbers expressing feature sizes, amounts, time periods, and physical properties are to be understood as being modified by the term "about." Accordingly, unless indicated to the contrary, the numerical parameters set forth are approximations that can vary depending upon the desired properties sought to be obtained by those skilled in the art utilizing the teachings disclosed herein.

The present invention has now been described with reference to several embodiments thereof. The entire disclosure of any patent or patent application identified herein is hereby incorporated by reference. The detailed description and examples have been given for clarity of understanding only. No unnecessary limitations are to be understood therefrom. It will be apparent to those skilled in the art that many changes can be made in the embodiments described without departing from the scope of the invention. Thus, the scope of the present invention should not be limited to the structures described herein, but only by the structures described by the language of the claims and the equivalents of those structures.

The invention claimed is:

1. A control system for a toasting appliance having a food carriage movable from a first position to a second position, comprising:
    a power circuit having a first power switch with a first set of electrical contacts that are closed when the food carriage is in the second position, the electrical contacts of the power switch configured to selectively provide an electrical connection from the power circuit to energize a heating element and an electromagnet that maintains the food carriage in the second position when the electromagnet is energized;
    a first timing circuit connected with the power circuit, the first timing circuit energized when the power circuit is energized and configured for controlling a heating time period of a food product when the food carriage is in the second position, and the first timing circuit configured to send a timer signal for causing the power circuit to de-energize at an expiration of the heating time period; and
    a second timing circuit connected with the power circuit in parallel with the first timing circuit, the second timing circuit energized when the first timing circuit is energized and configured for timing a secondary time period that is at least as long as the heating time period, and the second timing circuit configured to send a signal for causing the power circuit to de-energize at an expiration of the secondary heating time period.

2. The control system of claim 1, wherein the first timing circuit and the second timing circuit each comprise an application specific integrated circuit.

3. The control system of claim 1, wherein the heating time period is configurable by a user.

4. The control system of claim 1, wherein the secondary heating time period is set to be a maximum time period setting of the toasting appliance.

5. The control system of claim 1, wherein the first timing circuit is operatively connected with the first power switch for de-energizing the power circuit by opening the first power switch.

6. The control system of claim 5, wherein the second timing circuit is operatively connected with a second power switch that is connected in series with the first power switch for de-energizing the power circuit by opening the second power switch.

7. The control system of claim 1, wherein the opening of either of the first and second power switches de-energizes the power circuit, which in turn de-energizes the electromagnet for releasing the movable food carriage.

8. The control system of claim 1, wherein the first timing circuit is selected from the group consisting of: a resistor-capacitor (RC) circuit, an application-specific integrated circuit, and a transistor based timing circuit.

9. The control system of claim 1, wherein the second timing circuit is selected from the group consisting of: a resistor-capacitor (RC) timing circuit, an application-specific integrated timing circuit, and a transistor based timing circuit.

10. A toaster, comprising:
    a food carriage movable from a first position to a second position;
    a heating element for heating a food product;
    an electromagnet for selectively holding the food carriage in the second position;
    a power circuit having a power switch with a first set of electrical contacts that are closed when the food carriage is in the second position, the electrical contacts of the power switch configured to selectively provide an electrical connection from the power circuit to energize the heating element and the electromagnet that maintains the food carriage in the second position when the electromagnet is energized; and
    a control circuit, comprising:
        a power circuit having a first power switch with a first set of electrical contacts that are closed when the food carriage is in the second position, the electrical contacts of the power switch configured to selectively provide an electrical connection from the power circuit to energize a heating element and an electromagnet that maintains the food carriage in the second position when the electromagnet is energized;
        a first timing circuit connected with the power circuit, the first timing circuit energized when the power circuit is energized and configured for controlling a heating time period of a food product when the food carriage is in the second position, and the first timing circuit configured to send a timing signal for causing the power circuit to de-energize at an expiration of the heating time period; and
        a second timing circuit connected with the power circuit in parallel with the first timing circuit, the second timing circuit energized when the first timing circuit is energized and configured for timing a secondary heating time period that is at least as long as the heating time period, and the second timing circuit configured to send a timing signal for causing the power circuit to de-energize at an expiration of the heating time period.

11. The toaster of claim 10, wherein the first timing circuit and the second timing circuit each comprise an application specific integrated circuit.

12. The toaster of claim 10, wherein the heating time period is configurable by a user.

13. The toaster of claim 10, wherein the secondary heating time period is set to be a maximum time period setting of the toasting appliance.

14. The toaster of claim 10, wherein the first timing circuit is operatively connected with the first power switch for de-energizing the power circuit by opening the first power switch.

15. The toaster of claim 14, wherein the second timing circuit is operatively connected with a second power switch that is connected in series with the first power switch for de-energizing the power circuit by opening the second power switch.

16. The toaster of claim 10, wherein the opening of either of the first and second power switches de-energizes the power circuit, which in turn de-energizes the electromagnet for releasing the movable food carriage.

17. The toaster of claim 10, wherein the first timing circuit is selected from the group consisting of: a resistor-capacitor (RC) circuit, an application-specific integrated circuit, and a transistor based timing circuit.

18. The toaster of claim 10, wherein the second timing circuit is selected from the group consisting of: a resistor-capacitor (RC) timing circuit, an application-specific integrated timing circuit, and a transistor based timing circuit.

19. A method for controlling a heating time period by an appliance, comprising:

closing a power switch to energize an appliance by a power circuit in response to actuating a food carriage of the appliance, wherein energizing the power circuit includes energizing a heating unit of the appliance and energizing an electromagnet for maintaining the food carriage in a heating position;

activating two parallel timing circuits upon closing the power switch and energizing the power circuit, wherein the two parallel timing circuits are each connected to the power circuit, and wherein each timing circuit is configured to individually send a timing signal to de-energize the power circuit and thus the heating element; and de-energizing the power circuit at the receipt of a timing signal from one of the two parallel timing circuits.

20. The method of claim 19, wherein each timing circuit of the parallel timing circuits is selected from the group consisting of: a resistor-capacitor (RC) circuit, an application-specific integrated circuit, and a transistor based timing circuit.

* * * * *